United States Patent
Yoon et al.

(10) Patent No.: US 10,040,683 B2
(45) Date of Patent: Aug. 7, 2018

(54) MULTI-LAYERED GRAPHENE SHEET AND METHOD OF FABRICATING THE SAME

(75) Inventors: Jong-hyuk Yoon, Changwon (KR);
Duk-hwa Na, Changwon (KR);
Young-il Song, Changwon (KR);
Dong-kwan Won, Changwon (KR);
Byung-hee Hong, Suwon (KR);
Na-young Kim, Changwon (KR)

(73) Assignees: SUNGKYUNKWAN UNIVERSITY FOUNDATION FOR CORPORATE COLLABORATION, Suwon-si (KR);
Hanwha Techwin Co., Ltd., Changwon-si (KR)

( * ) Notice: Subject to any disclaimer, the term of this patent is extended or adjusted under 35 U.S.C. 154(b) by 1293 days.

(21) Appl. No.: 13/298,944

(22) Filed: Nov. 17, 2011

(65) Prior Publication Data
US 2012/0128983 A1    May 24, 2012

(30) Foreign Application Priority Data

Nov. 17, 2010   (KR) .................. 10-2010-0114559
Aug. 1, 2011    (KR) .................. 10-2011-0076577

(51) Int. Cl.
*B32B 9/00*      (2006.01)
*B82Y 40/00*     (2011.01)
(Continued)

(52) U.S. Cl.
CPC .............. *B82Y 40/00* (2013.01); *B82Y 30/00* (2013.01); *C01B 32/182* (2017.08); *Y10T 156/10* (2015.01); *Y10T 428/30* (2015.01)

(58) Field of Classification Search
CPC ............ C01B 31/0438; C01B 2204/00; Y10T 428/30
(Continued)

(56) References Cited

U.S. PATENT DOCUMENTS

2005/0036905 A1*  2/2005  Gokturk ................ B82Y 15/00
                                                        422/400
2009/0155561 A1   6/2009  Choi et al.
(Continued)

FOREIGN PATENT DOCUMENTS

JP     2010-282729 A    12/2010
KR   10-2009-0065206 A   6/2009
KR   10-2011-0052300 A   5/2011

OTHER PUBLICATIONS

Communication dated Apr. 13, 2017 issued by the Korean Intellectual Property Office in counterpart Korean Patent Application No. 10-2010-0114559.

*Primary Examiner* — Daniel H Miller
(74) *Attorney, Agent, or Firm* — Sughrue Mion, PLLC

(57) ABSTRACT

A method of fabricating multi-layered graphene includes disposing a first graphene layer on a carrier; disposing at least one second graphene layer on the first graphene layer to form a graphene sheet disposed on the carrier; and transferring the graphene sheet disposed on the carrier onto a substrate, wherein each of the graphene layers which constitute the graphene sheet has at least one damaged region, and the at least one damaged region of each of the graphene layers contacts at least one of non-damaged regions of a graphene layer or graphene layers, of the graphene layers, contacting the each of the graphene layers.

8 Claims, 16 Drawing Sheets

(51) Int. Cl.
   *B82Y 30/00* (2011.01)
   *C01B 32/182* (2017.01)
(58) Field of Classification Search
   USPC .......................................... 428/408; 423/448
   See application file for complete search history.

(56) References Cited

U.S. PATENT DOCUMENTS

2011/0048625 A1* 3/2011 Caldwell ................ B82Y 30/00
 156/233
2011/0068290 A1* 3/2011 Haddon ............... C12Q 1/6881
 252/62.51 R

* cited by examiner

MULTI-LAYERED GRAPHENE SHEET AND METHOD OF FABRICATING THE SAME

CROSS-REFERENCE TO RELATED PATENT APPLICATIONS

This application claims priority from Korean Patent Application No. 10-2010-0114559, filed on Nov. 17, 2010, and Korean Patent Application No. 10-2011-0076577, filed on Aug. 1, 2011 in the Korean Intellectual Property Office, the disclosures of which are incorporated herein in their entirety by reference.

BACKGROUND

1. Field

Methods and apparatuses consistent with exemplary embodiment relate to fabricating multi-layered graphene or a graphene sheet including a plurality of graphene layers.

2. Description of the Related Art

Currently, carbon nanotubes, diamonds, graphite, and graphene are being researched in various fields as carbon-based materials.

Among these materials, carbon nanotubes have been highlighted since 1990s. Recently, however, graphene having a plate structure has drawn great attention. Graphene is a thin film material of about a few nm in thickness in which carbon atoms are arranged two-dimensionally. Since electric charges function as zero effective mass particles in the graphene, the graphene has very high electric conductivity, high thermal conductivity, and elasticity.

Therefore, a lot of research on the graphene has been made to utilize the graphene in various fields. As described above, the graphene may be suitably applied to a transparent and flexible device due to its high electric conductivity and elasticity.

SUMMARY

One or more exemplary embodiments provide multi-layered graphene or a graphene sheet including a plurality of graphene layers, and a method of fabricating the same.

According to an aspect of an exemplary embodiment, there is provided a method of fabricating multi-layered graphene, the method including: disposing a first graphene layer on a carrier; disposing at least one second graphene layer on the first graphene layer to form a graphene sheet disposed on the carrier; and transferring the graphene sheet disposed on the carrier onto a substrate.

The method may further include removing the carrier, after the transferring the graphene sheet onto the substrate.

The carrier may include polymer.

The carrier may include a thermal release tape.

The transferring the graphene sheet onto the substrate may include: disposing a heated laminator on the carrier; and compressing the carrier by using the heated laminator.

The disposing the first graphene layer on the carrier may include: disposing the first graphene layer on a first catalyst metal layer; disposing the carrier on the first graphene layer; and removing the first catalyst metal layer.

The disposing the at least one second graphene layer on the first graphene layer may include: disposing the at least one second graphene layer on a second catalyst metal layer; disposing the at least one second graphene layer disposed on the second catalyst metal layer on the first graphene layer that is disposed on the carrier; and removing the second catalyst metal layer.

The disposing the at least one second graphene layer may include disposing N different graphene layers (N is a natural number equal to 2 or greater) on the first graphene layer, and wherein the disposing the N different graphene layers includes repeating following operations N times: disposing one graphene layer on the second catalyst metal layer; disposing the one graphene layer, disposed on the second catalyst metal layer, on the first graphene layer that is disposed on the carrier; and removing the second catalyst layer.

According to an aspect of another exemplary embodiment, there is provided a graphene sheet fabricated by the fabricating method described above.

The graphene sheet may include a plurality of graphene layers, at least one of which has at least one damaged region, wherein the at least one damaged region of each of the graphene layers contacts at least one of non-damaged regions of a graphene layer or graphene layers, of the graphene layers, contacting the each of the graphene layers.

According to an aspect of an exemplary embodiment, there is provided a method of fabricating multi-layered graphene, the method including: disposing a first graphene layer on a substrate; disposing at least one second graphene layer on the first graphene layer; and laminating the first graphene layer and the at least one second graphene layer to be integrated with one another.

At least one of the first graphene layer and the at least one second graphene layer may have at least one damaged region.

Each of the first graphene layer and the at least one second graphene layer may have at least one damaged region, and the disposing the at least one second graphene layer may include disposing the at least one second graphene layer each of any two graphene layers, among the first graphene layer and the at least one second graphene layer, contacting each other does not have a damaged region overlapping another damaged region of the other of any two graphene layers.

The disposing the at least one second graphene layer may include disposing the at least one second graphene layer such that a surface of the at least one second graphene layer, which is opposite to the other surface of the at least one second graphene layer contacting the carrier, contacts the first graphene layer.

The method may further include removing the carrier, after the laminating of the first graphene layer and the at least one second graphene layer.

The carrier may include a thermal release tape.

The laminating the first graphene layer and the at least one second graphene layer may include: conveying a stacked structure including the first graphene layer and the at least one second graphene layer toward a laminator; and integrating the first graphene layer and the at least one second graphene layer with one another using the laminator, wherein the laminator radiates heat.

According to an aspect of an exemplary embodiment, there is provided a graphene sheet fabricated by the fabricating method described above wherein the graphene sheet includes the laminated first graphene layer and the at least one second graphene layer.

Each of the graphene layers which constitute the graphene sheet may have at least one damaged region, and the at least one damaged region of each of the graphene layers contacts at least one of non-damaged regions of a graphene layer or graphene layers contacting the each of the graphene layers.

According to an aspect of an exemplary embodiment, there is provided a graphene sheet including: a first graphene layer disposed on a substrate; and at least one second graphene layer disposed on the first graphene layer, wherein at least one of the first graphene layer and the at least one second graphene layer has at least one damaged region, and the at least one damaged region of each of the graphene layers constituting the graphene sheet contacts at least one of non-damaged regions of a graphene layer or graphene layers, of the graphene layers, contacting the each of the graphene layers.

BRIEF DESCRIPTION OF THE DRAWINGS

The above and other aspects will become more apparent by describing in detail exemplary embodiments with reference to the attached drawings, in which.

DETAILED DESCRIPTION OF THE EXEMPLARY EMBODIMENTS

Figure 1:
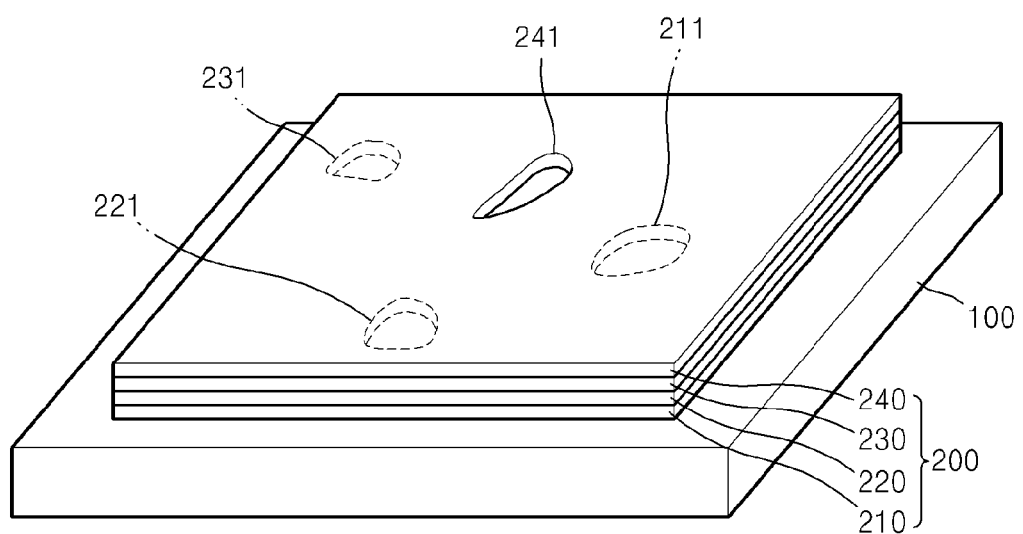
FIG. 1 is a perspective view of a graphene sheet according to an exemplary embodiment.

As used herein, expressions such as "at least one of," when preceding a list of elements, modify the entire list of elements and do not modify the individual elements of the list.

Hereinafter, exemplary embodiments will be described more fully with reference to the accompanying drawings. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity. The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section, respectively. Thus, a first element, component, region, layer or section discussed below could be termed a second element, component, region, layer or section without departing from the teachings of the inventive concept.

In the present specification, lamination refers to a process of integrating at least two graphene layers on a target substrate, and a laminator denotes an apparatus used to integrate the at least two graphene layers. For example, the laminator may be a roller that integrates at least two graphene layers through rotating movement. As another example, the laminator may be a stamp (or press) type laminator that integrates at least two graphene layers by linear movements.

FIG. 1 is a perspective view of a graphene sheet 200 according to an exemplary embodiment.

Referring to FIG. 1, the graphene sheet 200 is disposed on a substrate 100, and the graphene sheet 200 includes a plurality of graphene layers 210, 220, 230, and 240. Here, at least one of the plurality of graphene layers 210, 220, 230, and 240 has a damaged portion. FIG. 1 shows an example in which all of the first, second, third, and fourth graphene layers 210, 220, 230, and 240 have damaged portions.

The substrate 100 is a target substrate on which the graphene sheet 200 is finally disposed and may be formed of, for example, a polymer such as polyethylene terephthalate (PET) or polyimide (PI).

The graphene sheet 200 includes at least two or more graphene layers 210, 220, 230, and 240. At least one of the graphene layers 210, 220, 230, and 240 has at least one damaged portion. Damage such as wrinkles, lattice disorder, or incomplete transfer may be generated during forming the first, second, third, and fourth graphene layers 210, 220, 230, and 240.

As an exemplary embodiment, if each of the first, second, third, and fourth graphene layers 210, 220, 230, and 240 is damaged, the first, second, third, and fourth graphene layers 210, 220, 230, and 240 may be disposed such that damaged regions 211, 221, 231, and 241 of the first, second, third, and fourth graphene layers 210, 220, 230, and 240 do not overlap with one another. For example, the first region 211, which is the damaged region of the first graphene layer 210, and the second region 221, which is the damaged region of the second graphene layer 220, are located at different locations so that the second graphene layer 220 may compensate for the first region 211 and the first and/or third graphene layer 210 and/or 230 may compensate for the second region 221. Likewise, the second and/or fourth graphene layers 220 and/or 240 compensate for the third region 231, which is the damaged region of the third graphene layer 230, and the third graphene layer 230 compensates for the fourth region 241, which is the damaged region of the fourth graphene layer 240.

In the present exemplary embodiment, the graphene sheet 200 includes four graphene layers, namely, first, second, third, and fourth graphene layers 210, 220, 230, and 240. However, the inventive concept is not limited thereto. For example, the graphene sheet may include less than or more than four graphene layers. The graphene sheet may be fabricated by stacking only the first and second graphene layers 210 and 220. As another exemplary embodiment, the graphene sheet may be fabricated by stacking the first, second, and third graphene layers 210, 220, and 230. As graphene layers are stacked, light transmittance of the graphene sheet 200 is reduced by about 2.3% per graphene layer. In a case where high transmittance is not desired, five or more graphene layers may be stacked.

In the present exemplary embodiment, the first, second, third, and fourth graphene layers 210, 220, 230, and 240 forming the graphene sheet 200 all have the damaged regions, namely, first, second, third, and fourth regions 211, 221, 231, and 241. However, the inventive concept is not limited thereto. For example, the first graphene layer 210 may have one or more damaged regions and the second graphene layer 220 may have no damaged region so that the second graphene layer 220 may compensate for the damaged region of the first graphene layer 210 no matter where the damaged portion is in the first graphene layer 210. As another example, the first and third graphene layers 210 and 230, each having at least one damaged region, may be disposed on opposite sides of the second graphene layer 220 that is not damaged.

Hereinafter, a method of fabricating a graphene sheet including a plurality of graphene layers will be described with reference to accompanying drawings.

<First Example>

Figure 2:
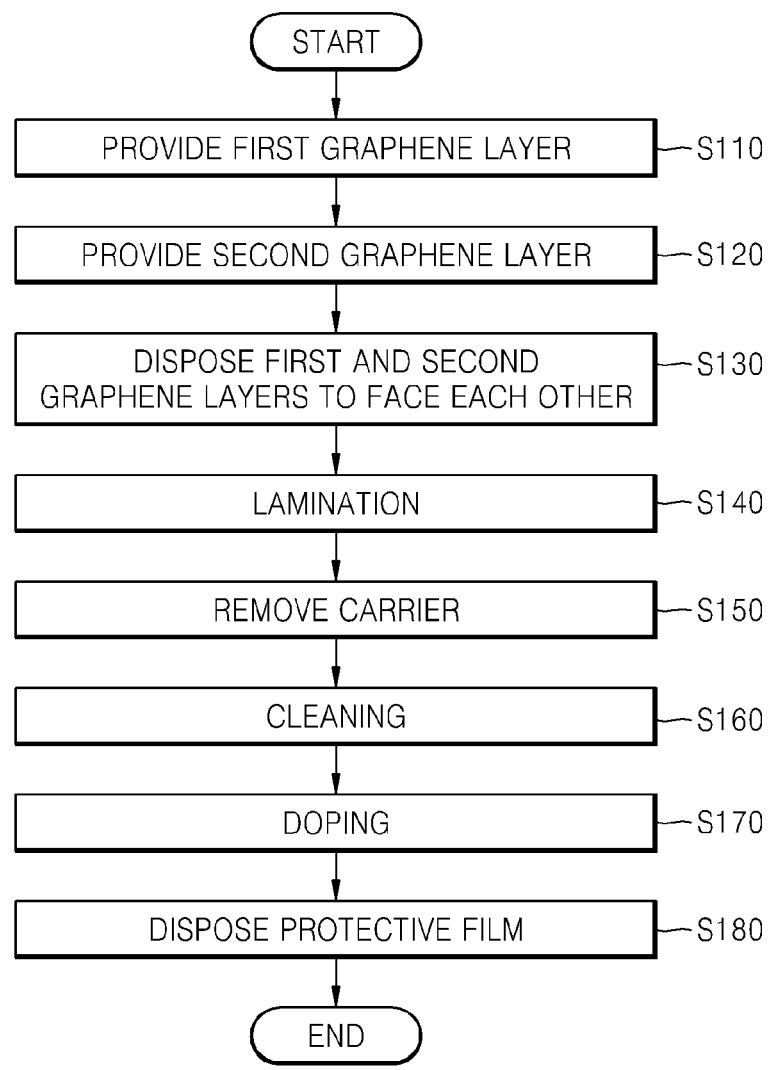
FIG. 2 illustrates a flowchart of a method of fabricating multi-layered graphene, according to an exemplary embodiment.
Figure 3:
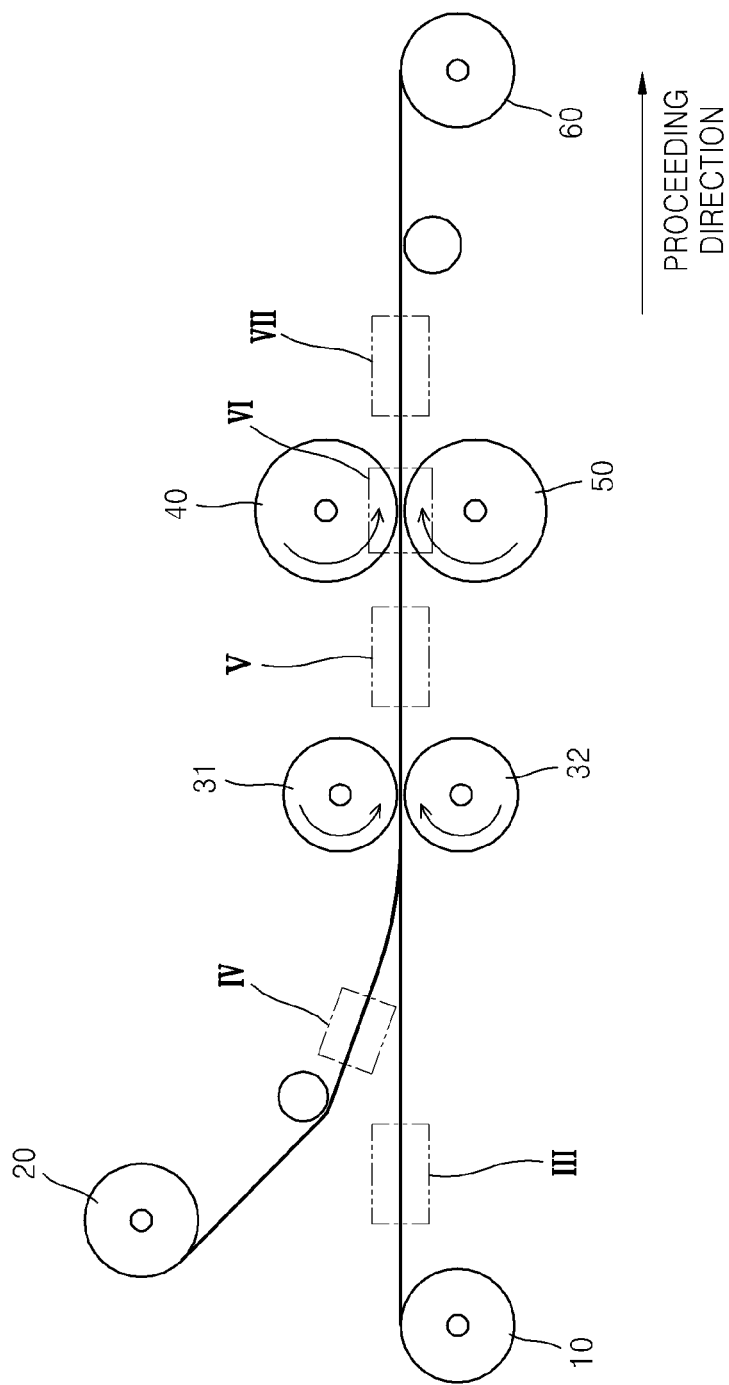
FIG. 3 schematically illustrates a process of FIG. 2, according to an exemplary embodiment.

FIGS. 2 and 3 illustrate a flowchart and a processing diagram of a method of fabricating multi-layered graphene or a graphene sheet including a plurality of graphene layers, respectively, according to an exemplary embodiment and FIGS. 4 through 8 illustrate cross-sectional views corresponding to the operations shown in FIGS. 2 and 3.

Figure 4:
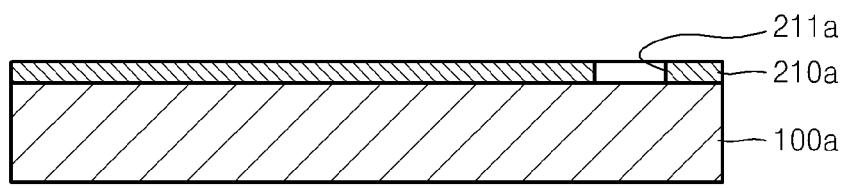
FIGS. 4 through 8 illustrate cross-sectional views corresponding to the operations shown in FIGS. 2 and 3, according to an exemplary embodiment.

Referring to FIGS. 2 through 4, in operation S110, a substrate 100a on which a first graphene layer 210a is stacked is prepared. The substrate 100a on which the first graphene layer 210a is stacked is provided by a reel 10. As an example, the first graphene layer 210a is transferred on the substrate 100a, during which a first region 211a of the first graphene layer 210a is damaged.

The substrate 100a may be a target substrate on which a final form of a graphene sheet is formed to be used in various fields. For example, the graphene sheet 200 (FIG. 1) is finally formed on the substrate 100a to be used as a touch screen along with the substrate 100a while the substrate 100a may be formed of a polymer such as PET or PI.

In the present exemplary embodiment, the substrate 100a on which the first graphene layer 210a is stacked is provided by using the reel 10. However, the inventive concept is not limited thereto. That is, the substrate 100a may be provided through different methods such as a method using a conveyor belt.

Figure 5:
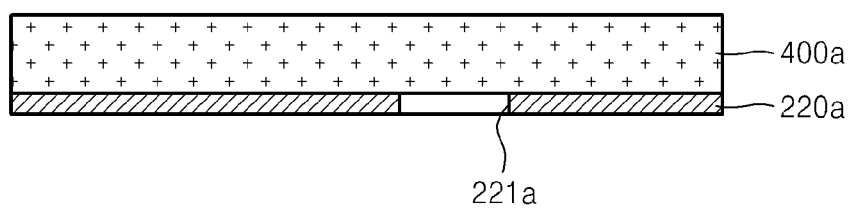

Referring to FIGS. 2, 3, and 5, in operation S120, a second graphene layer 220a is provided. The second graphene layer 220a is provided by a reel 20 while being attached to a carrier 400a. The second graphene layer 220a may have a second damaged region 221a. As another example, the second graphene layer 220a may not be damaged. Hereinafter, it is assumed that the second graphene layer 220a is damaged, for convenience of description.

The carrier 400a protects a surface of the second graphene layer 220a. The carrier 400a may be a thermal release tape, for example. According to the present exemplary embodiment, the second graphene layer 220a to which the carrier 400a is attached is provided by the reel 20. However, the present exemplary embodiment is not limited thereto. For example, the second graphene layer 220a may be provided by different methods such as a method using a conveyor belt.

Figure 6:
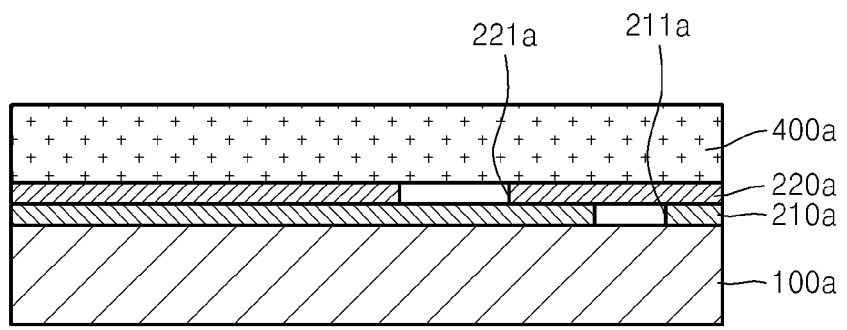

Referring to FIGS. 2, 3, and 6, in operation S130, the first graphene layer 210a and the second graphene layer 220a are disposed to face each other. Here, the first graphene layer 210a is disposed on the substrate 100a, and the second graphene layer 220a contacts the carrier 400a. In addition, the first and second graphene layers 210a and 220a are disposed so that the first region 211a of the first graphene layer 210a and the second damaged region 221a of the second graphene layer 220a may not overlap with each other.

The first graphene layer 210a disposed on the substrate 210a and the second graphene layer 220a moved by the carrier 400a may be aligned while passing between rollers 31 and 32. For example, in order to prevent wrinkles from generating during lamination process, the first and second graphene layers 210a and 220a pass between the rollers 31 and 32. The first and second graphene layers 210a and 220a are planarized while passing between the rollers 31 and 32. The present process of passing the first and second graphene layers 210a and 220a between the rollers 31 and 32, that is, a preliminary process of the lamination, may be omitted or replaced by a different method of planarizing the first and the second graphene layers 210a and 220a.

The stacked structure of the first graphene layer 210a disposed on the substrate 100a and the second graphene layer 220a moved by the carrier 400a proceeds to a laminator 40.

Figure 7:
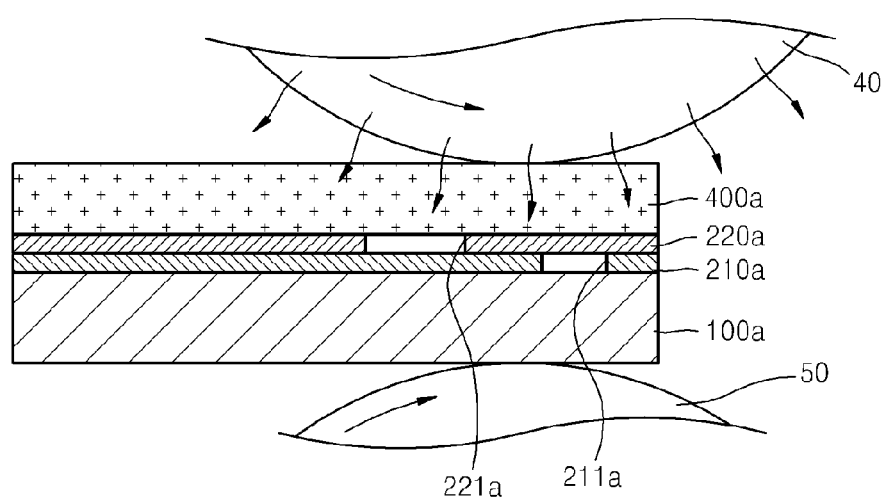

Referring to FIGS. 2, 3, and 7, in operation S140, the first and second graphene layers 210a and 220a are integrated with each other by the laminator 40 (lamination). For example, the laminator 40 may be formed as a roller to integrate the first graphene layer 210a and the second graphene layer 220a while pushing the stacked structure away. The laminator 40 applies a predetermined pressure to the first and second graphene layers 210a and 220a with a roller 50 to integrate the first and second graphene layers 210a and 220a.

The roller 50 is disposed on a lower portion of the laminator 40 separately by a predetermined distance from the laminator 40, and rotates with the laminator 40 to make the stacked structure of the first and second graphene layers 210a and 220a proceed in a direction. The distance between the laminator 40 and the roller 50 may correspond to a thickness of the stacked structure of the first and second graphene layers 210a and 220a. Thus, the first and second graphene layers 210a and 220a may be bonded to each other without applying excessive pressure to the stacked structure of the first and second graphene layers 210a and 220a.

Referring to FIG. 2, in operation S150, the carrier 400a is removed. If a thermal release tape is used as the carrier 400a, the lamination (S140) and removal of the carrier 400a (S150) are performed simultaneously. That is, the laminator 40 may remove the carrier 400a while integrating the first and second graphene layers 210a and 220a. Referring to FIG. 7, the laminator 40 is heated to radiate heat, and to do this, the laminator 40 may include a metal material. A temperature of the laminator 40 may be about 90° C. to about 120° C. or greater according to a kind of the thermal release tape. As a rotating speed of the roller type laminator 40 is fast, the temperature of the laminator may be increased.

Figure 8:
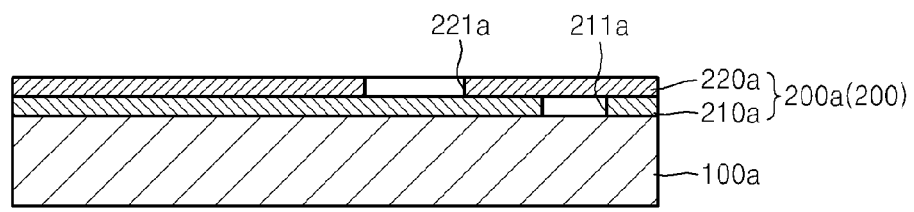

FIG. 8 shows when the carrier 400a, that is the thermal release tape, is removed and a graphene sheet 200a including the first and second graphene layers 210a and 220a is formed on the target substrate 100a.

In the present exemplary embodiment, the thermal release tape is used as the carrier 400a. However, the inventive concept is not limited thereto. As another exemplary embodiment, the carrier 400a may be formed of photoresist, water-soluble polyurethane resin, water-soluble epoxy resin, water-soluble acryl resin, water-soluble natural polymer resin, water-based adhesive, alcohol release tape, vinyl acetate emulsion adhesive, hot-melt adhesive, visible ray curable adhesive, infrared ray (IR) curable adhesive, electron beam (EB) curable adhesive, polybenzimidazole (PBI) adhesive, Polyimide (PI) adhesive, silicon adhesive, imide adhesive, bismaleimide (BMI) adhesive, or modified epoxy resin.

If the carrier 400a is not a thermal release tape, the carrier 400a may be removed in various manners subject to a material forming the carrier 400a. As an example, if the carrier 400a includes a material such as Poly(methyl methacrylate) (PMMA), the modified epoxy resin, the PI adhesive, or the imide adhesive, the carrier 400a may be removed by alkali. As another example, if the carrier 400a includes a material such as the modified epoxy, the carrier 400a may be removed using an organic solvent such as ketone, ester, or chlorinated hydrocarbon. Otherwise, if a material such as the water-soluble acryl resin, the water-soluble epoxy resin, or the water-soluble polyurethane resin is used as the carrier 400a, the carrier 400a may be removed using water.

Referring to FIG. 2, in operation S160, the graphene sheet 200a formed on the substrate 100a may be cleaned to remove impurities generated after the operation S150, and the cleaning process may be omitted if desired.

In operation S170, the graphene sheet 200a including the first and second graphene layers 210a and 220a may be doped. Through the additional doping process, a surface resistance of the graphene sheet 200a may be improved. However, the doping process may be omitted.

In operation S180, a protective film (not shown) may be disposed on the graphene sheet 200a to protect the graphene sheet 200a against external contamination materials. As another example, the substrate 100a itself may be the protective film, and in this case, operation S180 may not be performed. Referring to FIG. 3, the substrate 100a and the graphene sheet 200a formed on the substrate 100a may be wound on a roller 60.

The processes described with reference to FIGS. 2 through 8 may be repeatedly performed as many times as the number of graphene layers forming the graphene sheet.

Figure 9:
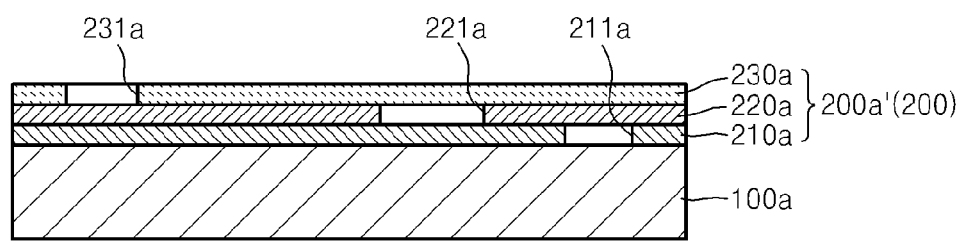
FIG. 9 illustrates a cross-sectional view of a graphene sheet including three graphene layers, according to an exemplary embodiment.
Figure 10:
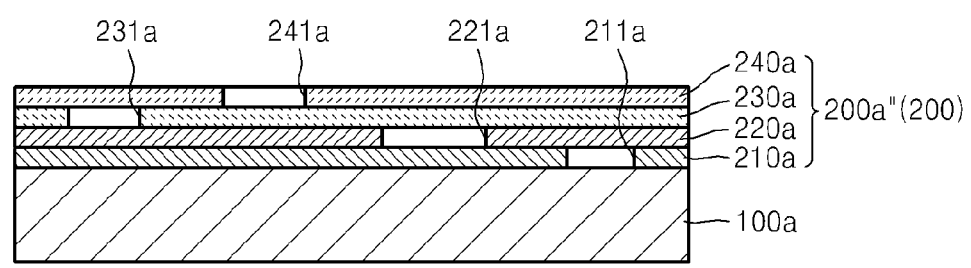
FIG. 10 illustrates a cross-sectional view of a graphene sheet including four graphene layers, according to an exemplary embodiment.

FIG. 9 illustrates a cross-sectional view showing a graphene sheet 200a' including three graphene layers, namely, first, second, and third graphene layers 210a, 220a, and 230a. The graphene sheet 200a' of the present exemplary embodiment may be fabricated by providing the graphene sheet 200a shown in FIG. 8 with the third graphene layer 230a, performing a lamination, and removing a carrier. FIG. 10 illustrates a cross-sectional view of a graphene sheet 200a" including four graphene layers, namely, first, second, third, and fourth graphene layers 210a, 220a, 230a, and 240a. The graphene sheet 200a" of the present exemplary embodiment may be fabricated by providing the graphene sheet 200a' shown in FIG. 9 with the fourth graphene layer 240a, performing a lamination, and removing a carrier.

The number of graphene layers and the number of repetitions the fabrication method is performed may be determined according to a kind of product in which the graphene sheet 200 will be used. For example, since the light transmittance is reduced by about 2.3% whenever one graphene layer is stacked, the light transmittance and the surface resistance may be considered.

<Second Example>

Figure 11:
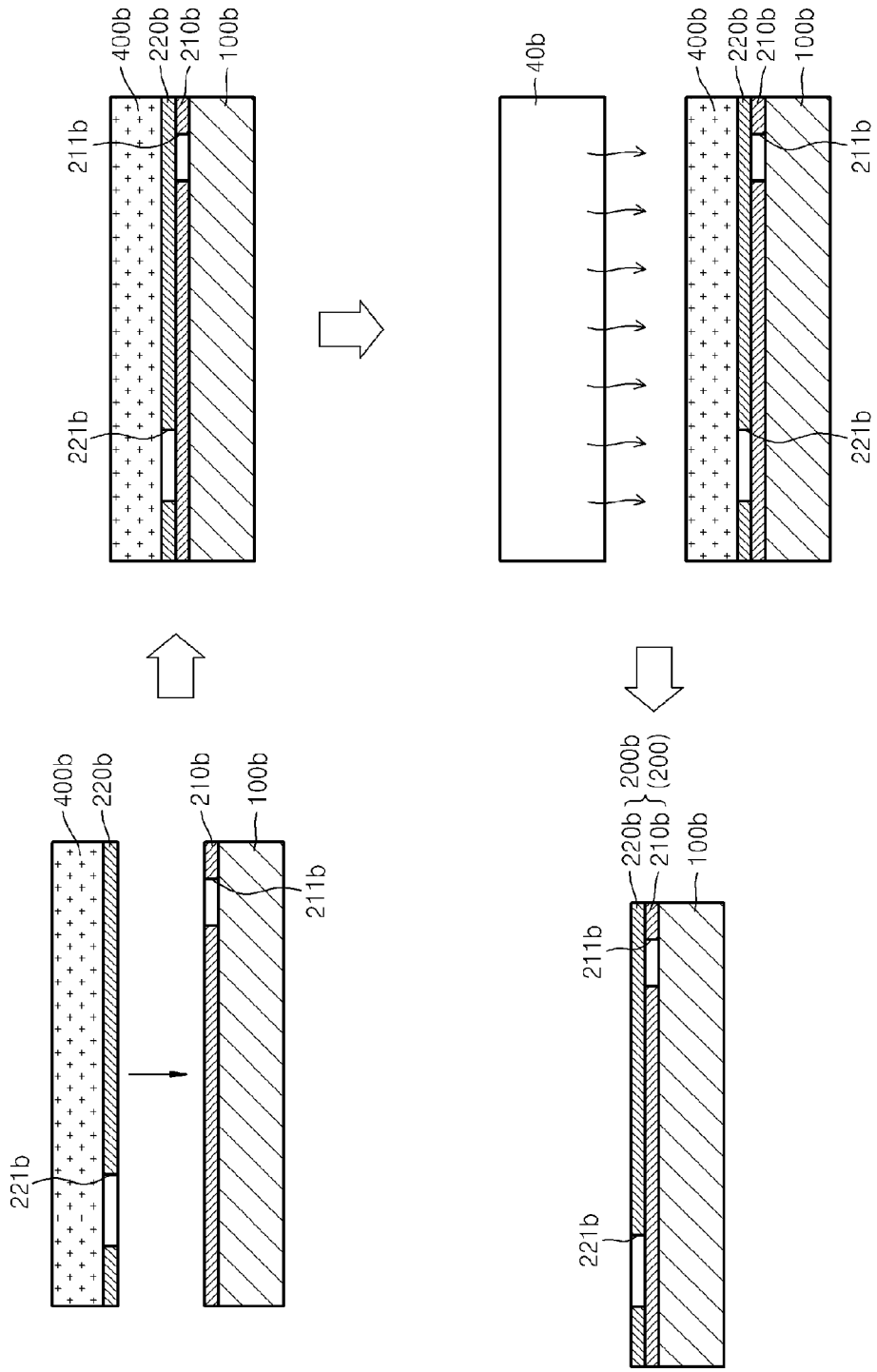
FIG. 11 illustrates a processing diagram illustrating a method of fabricating multi-layered graphene, according to another exemplary embodiment.

FIG. 11 illustrates a processing diagram illustrating a method of fabricating multi-layered graphene or a graphene sheet including a plurality of graphene layers, according to another exemplary embodiment. The method of fabricating the multi-layered graphene of the present exemplary embodiment is different from that of the previous exemplary embodiment in that a laminator of the present exemplary embodiment is a stamp type (or press) laminator, not a roller type laminator. Hereinafter, differences of the present exemplary embodiment from the previous exemplary embodiment will be described and the same elements as those of the previous exemplary embodiment will not be described.

Referring to FIG. 11, a substrate 100b on which a first graphene layer 210b is stacked and a second graphene layer 220b are provided. The second graphene layer 220b is provided by being adhered to a carrier 400b.

Here, the first graphene layer 210b is transferred on the substrate 100b and has a first damaged region 211b. The substrate 100b may be a target substrate on which a final form of a graphene sheet 200b is formed to be used. The second graphene layer 220b may have a second damaged region 221b or may not have a damaged region. Hereinafter, it is assumed that the second graphene layer 220b has a damaged region, for convenience of description.

Then, a laminator 40b is disposed on the carrier 400b. The laminator 40b is a stamp (or press) type laminator that linearly moves, unlike the laminator 40a of the previous exemplary embodiment. For example, the laminator 40b is vertically descended.

The stamp type laminator 40b is vertically descended toward the carrier 400b to apply a predetermined pressure onto the stacked structure of the first graphene layer 210b disposed on the substrate 100b and the second graphene layer 220b disposed with the carrier 400b.

The laminator 40b of the present exemplary embodiment may be also heated. The heating temperature is the same as the previous exemplary embodiment, and thus, the laminator 40b of the stamp type may be formed of a material that has thermal conductivity such as a metal.

The first and second graphene layers 210b and 220b are integrated (lamination) by the laminator 40b, and at the same time, the carrier 400b, that is, a thermal release tape, is isolated by heat radiated from the laminator 40b. After performing the lamination process, the graphene sheet 200b formed of the first and second graphene layers 210b and 220b is formed on the substrate 100b.

In the present exemplary embodiment, the thermal release tape is used as the carrier 400b. However, the inventive concept is not limited thereto. As another exemplary embodiment, the carrier 400b may be formed of photoresist, water-soluble polyurethane resin, water-soluble epoxy resin, water-soluble acryl resin, water-soluble natural polymer resin, water-based adhesive, alcohol release tape, vinyl acetate emulsion adhesive, hot-melt adhesive, visible ray curable adhesive, IR curable adhesive, EB curable adhesive, PBI adhesive, PI adhesive, silicon adhesive, imide adhesive, BMI adhesive, or modified epoxy resin.

If the carrier 400b is not a thermal release tape, the laminator 40b compresses the first and second graphene layers 210b and 220b without radiating heat, and the carrier 400b may be removed in various manners subject to a material forming the carrier 400b. As an example, if the carrier 400b includes a material such as PMMA, the modified epoxy resin, the PI adhesive, or the imide adhesive, the carrier 400b may be removed by alkali. As another example, if the carrier 400b includes a material such as the modified epoxy, the carrier 400b may be removed using an organic solvent such as ketone, ester, or chlorinated hydrocarbon. Otherwise, if a material such as the water-soluble acryl resin, the water-soluble epoxy resin, or the water-soluble polyurethane resin is used as the carrier 400b, the carrier 400b may be removed using water.

The stacked structure including the first and second graphene layers 210b and 220b moving toward the laminator 40b may be conveyed via a conveying roller (not shown). Otherwise, the stacked structure may be moved by a conveyor belt (not shown).

Then, the graphene sheet 200b formed on the substrate 100b may be cleaned to remove impurities generated after the lamination process. However, the cleaning process may be omitted if desired.

The graphene sheet 200b including the first and second graphene layers 210b and 220b may be doped. Through the additional doping process, a surface resistance of the graphene sheet 200b may be improved. However, the doping process may be omitted. In addition, a protective film (not shown) may be disposed on the graphene sheet 200b to protect the graphene sheet 200b against external contamination materials. As another example, the substrate 100b itself may be the protective film, and in this case, an operation of disposing the protective film may not be performed.

Tables 1 and 2 represent surface resistance values of a graphene sheet fabricated according to the above exemplary embodiment (First Example) and a graphene sheet fabricated by a first comparative example.

Figure 26:
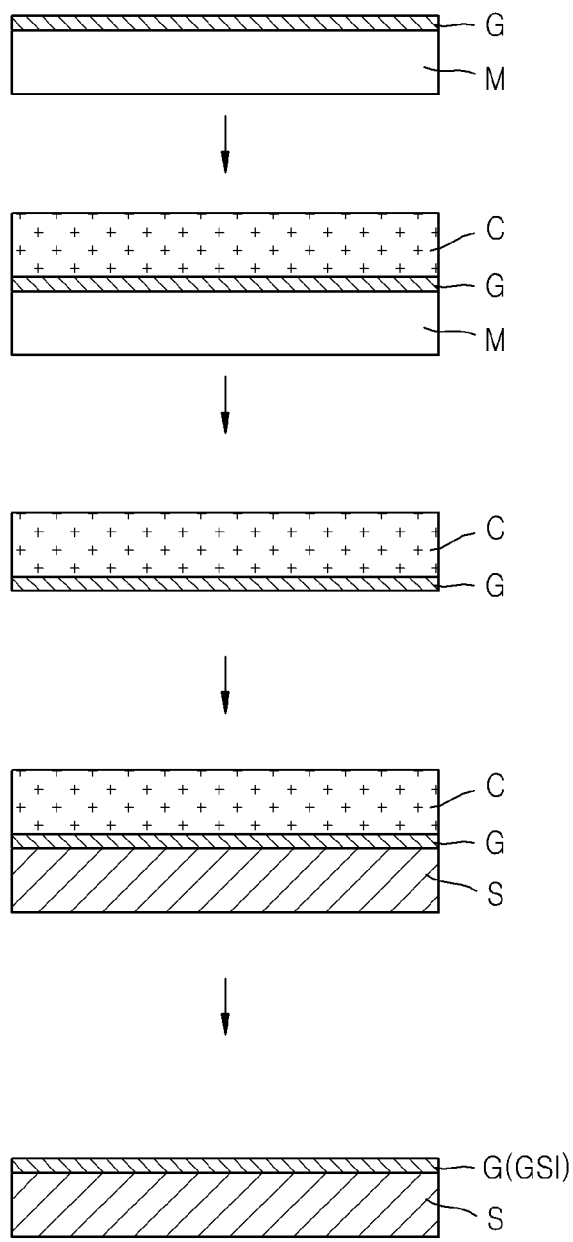
FIG. 26 illustrates a method of fabricating a graphene sheet including one graphene layer, according to a first comparative example.

A method of forming a graphene sheet according to the first comparative example is as follows (refer to FIG. 26).

First, a graphene layer G is disposed on a catalyst metal layer M including copper by a chemical vapor deposition (CVD) method. Here, the graphene layer G has a single layer, and a thermal release tape is disposed on the graphene layer G as a carrier C. Then, the catalyst metal layer M is removed by etching, the carrier C and a single-layered graphene layer G disposed on a surface of the carrier C remain. Then, the graphene layer G is transferred onto a substrate S. Here, the thermal release tape is released by heat. The graphene sheet GS1 according to the first comparative example is fabricated in the above manner.

The graphene sheets according to the above exemplary embodiment and the first comparative example were fabricated by using the thermal release tape as the carrier, and surface resistance was measured by an automatic surface resistor. Fabrication of a graphene sheet according to the above exemplary embodiment and a graphene sheet according to the first comparative example were performed twice, respectively, and results are shown in Table 1 and Table 2. The graphene sheets shown in Table. 1 and the graphene sheets shown in Table. 2 have different damaged regions and sizes from each other.

TABLE 1

| Number of graphene layer laminations | | First Comparative example 1 layer | Exemplary Embodiment | | |
|---|---|---|---|---|---|
| | | | 2 layers | 3 layers | 4 layers | 5 layers |
| Surface resistance at each measuring point (Ω) | 1 | 934 | 328 | 237 | 191 | 178 |
| | 2 | 595 | 349 | 239 | 190 | 185 |
| | 3 | 715 | 345 | 241 | 180 | 189 |
| | 4 | 709 | 335 | 234 | 181 | 185 |
| | 5 | 1210 | 353 | 223 | 179 | 168 |
| | 6 | 727 | 393 | 214 | 179 | 172 |
| | 7 | 1469 | 321 | 218 | 184 | 166 |
| | 8 | 1492 | 483 | 222 | 185 | 179 |
| | 9 | 1243 | 477 | 232 | 181 | 181 |
| Results | Avg. | 1011 | 376 | 229 | 183 | 175 |
| | Min. | 595 | 321 | 214 | 179 | 166 |
| | Max. | 1492 | 483 | 241 | 191 | 181 |
| | Uniformity | 44 | 22 | 6 | 3 | 4 |

TABLE 2

| Number of graphene layer laminations | | First Comparative example 1 layer | Exemplary Embodiment | | |
|---|---|---|---|---|---|
| | | | 2 layers | 3 layers | 4 layers | 5 layers |
| Surface resistance at each measuring point (Ω) | 1 | 4389 | 1272 | 238 | 182 | 166 |
| | 2 | Probe err. | 1626 | 231 | 177 | 161 |
| | 3 | Probe err. | 442 | 234 | 196 | 164 |
| | 4 | 999 | 488 | 246 | 187 | 142 |
| | 5 | 1212 | 424 | 260 | 202 | 140 |
| | 6 | 1384 | 352 | 255 | 204 | 178 |
| | 7 | 1106 | Measurement was made at six points. | | | |
| | 8 | 2139 | | | | |
| | 9 | Probe err. | | | | |
| Results | Avg. | 1871 | 767 | 244 | 191 | 158 |
| | Min. | 999 | 352 | 231 | 177 | 140 |
| | Max. | 4389 | 1626 | 260 | 204 | 178 |
| | Uniformity | 91 | 83 | 6 | 7 | 12 |

Referring to Table 1 and Table 2, the surface resistance of the graphene sheets formed according to the exemplary embodiment is greatly reduced. For example, according to the first comparative example shown in Table 1, an average value of the surface resistances is about 1011Ω, while the average value of the surface resistances according to the exemplary embodiment is about 376 Ω, 229 Ω, 191Ω, and 175Ω. According to the first comparative example shown in Table 2, the average value of the surface resistances is 1871Ω, while the average value of the surface resistances according to the embodiment is about 767 Ω, 244 Ω, 191Ω, and 158Ω.

In addition, with respect to surface resistance uniformity between the surface resistance measuring points on the graphene sheet, the graphene sheet fabricated by the method according to the present exemplary embodiment has better uniform surface resistances.

In the case of the graphene sheet GS1 fabricated according to the first comparative example, a surface roughness of the thermal release tape, that is, the carrier C, is greater than a thickness of the graphene layer G, and thus, the graphene layer G may be damaged during transferring the graphene layer G on the substrate and removing the carrier C. This damage may affect the surface resistance value and the surface resistance uniformity. On the other hand, according to the present exemplary embodiment, since a plurality of graphene layers are stacked, even if there is damage in one of the graphene layers, other graphene layers may compensate for the damage. Therefore, the surface resistance characteristics of the graphene sheet may be excellent.

<Third Example>

Figure 12:
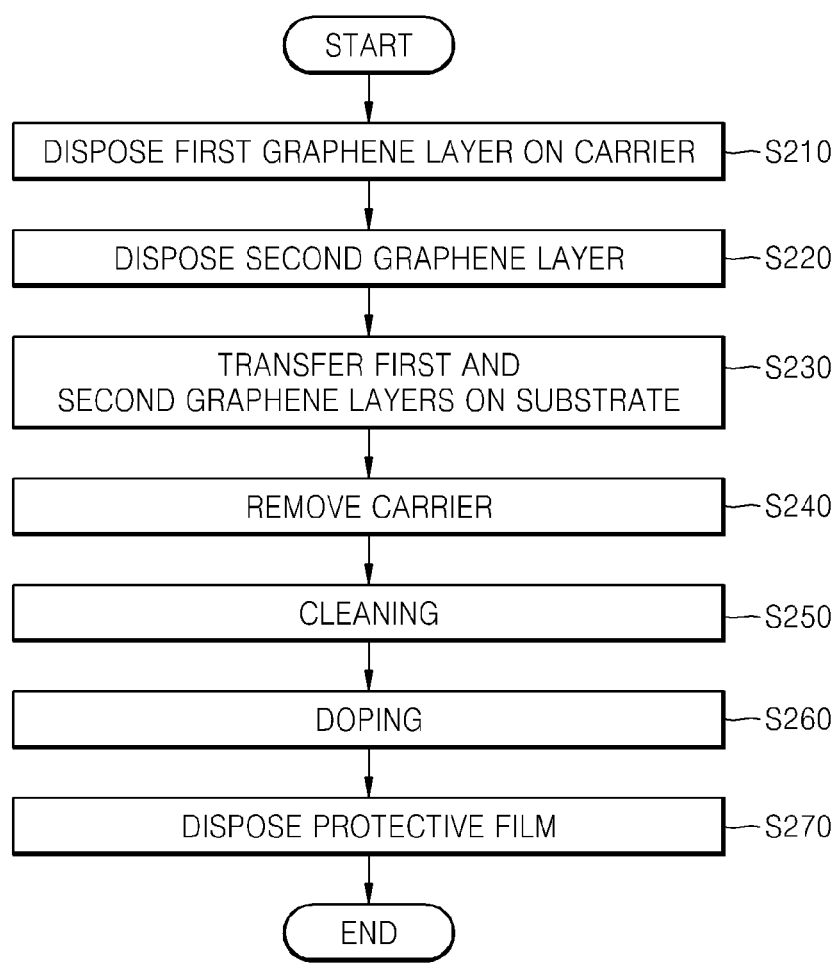
FIG. 12 illustrates a flowchart of a method of fabricating multi-layered graphene, according to another exemplary embodiment.
Figure 13:
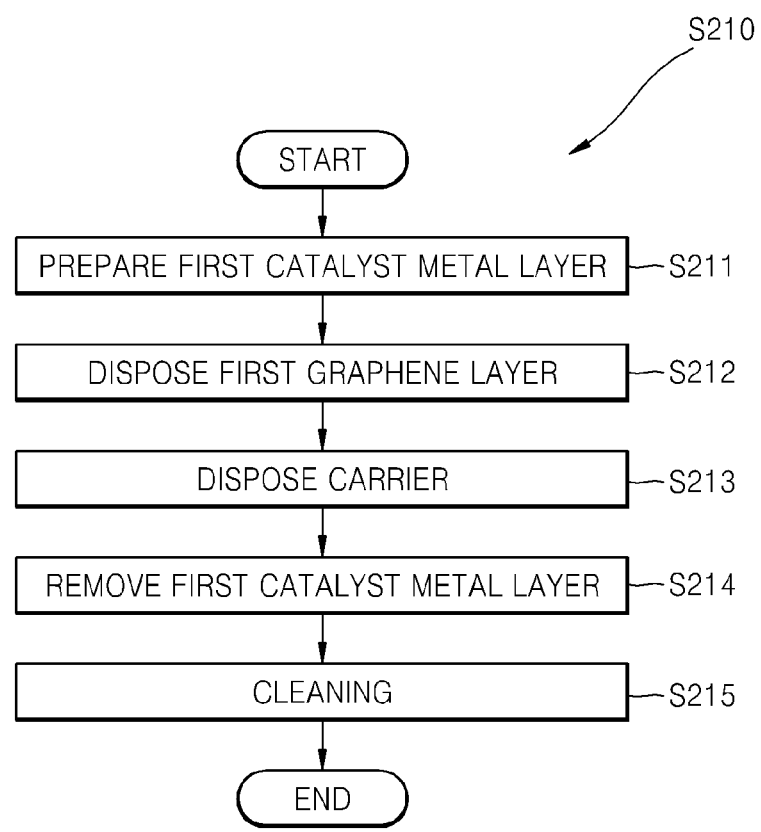
FIG. 13 illustrates a flowchart of an operation (S120) of disposing a first graphene layer shown in FIG. 12, according to an exemplary embodiment.
Figure 23:
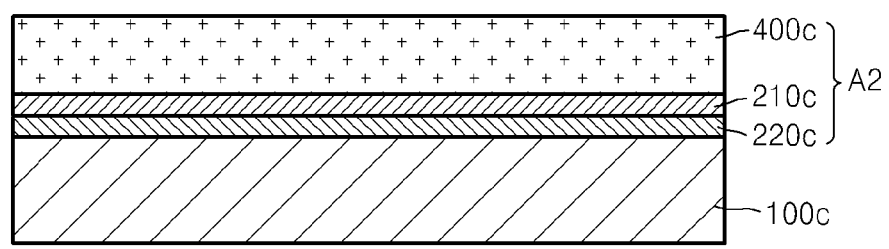
FIGS. 23 through 25 illustrate cross-sectional views corresponding to the operations S230 and S240 of FIG. 12, according to an exemplary embodiment.
Figure 24:
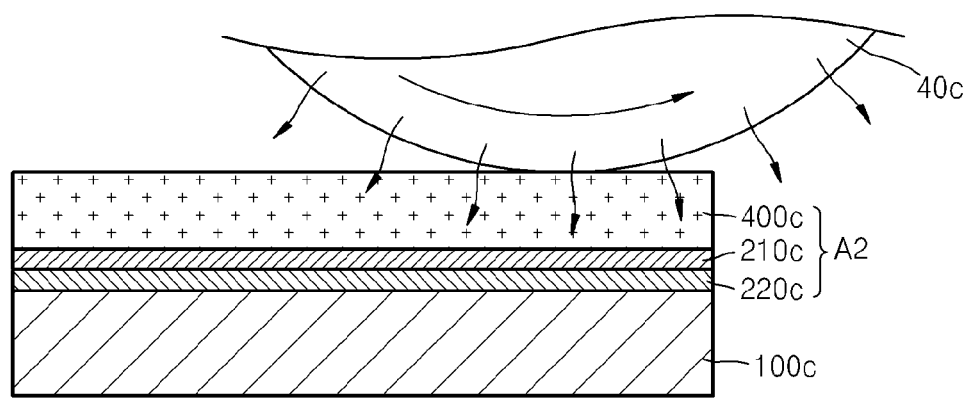
Figure 25:
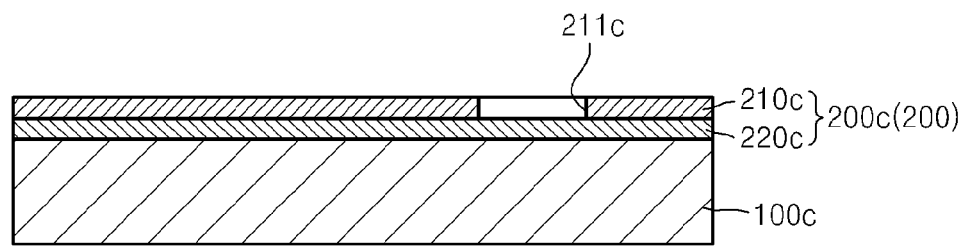

FIG. 12 illustrates a flowchart of a method of fabricating multi-layered graphene or a graphene sheet including a plurality of graphene layers, according to another exemplary embodiment. FIG. 13 illustrates a flowchart of operation S210 of disposing a first graphene layer shown in FIG. 12, and FIGS. 14 through 17 illustrate cross-sectional views corresponding to the operations shown in FIGS. 12 and 13. FIG. 18 illustrates a flowchart of operation S220 of disposing a second graphene layer shown in FIG. 12, and FIGS. 19 through 22 illustrate cross-sectional views corresponding to the operations shown in FIG. 18. FIGS. 23 through 25 illustrate cross-sectional views corresponding to operations S230 and S240 shown in FIG. 12.

Referring to FIG. 12, the first graphene layer is disposed on a carrier in operation S210. The carrier conveys a graphene layer. In this regard, the carrier is used to transfer the first graphene layer and the second graphene layer on a target substrate.

The carrier may include a polymer. A thermal release tape may be used as the carrier. As another example, the carrier may be formed of photoresist, water-soluble polyurethane resin, water-soluble epoxy resin, water-soluble acryl resin, water-soluble natural polymer resin, water-based adhesive, alcohol release tape, vinyl acetate emulsion adhesive, hot-melt adhesive, visible ray curable adhesive, IR curable adhesive, EB curable adhesive, PBI adhesive, PI adhesive, silicon adhesive, imide adhesive, BMI adhesive, or modified epoxy resin.

Hereinafter, operation S210 of disposing the first graphene layer on a carrier will be described in more detail with reference to FIGS. 13 through 17.

Figure 14A:
FIGS. 14 through 17 illustrate cross-sectional views corresponding to the operations of FIG. 13, according to an exemplary embodiment.
Figure 14B:
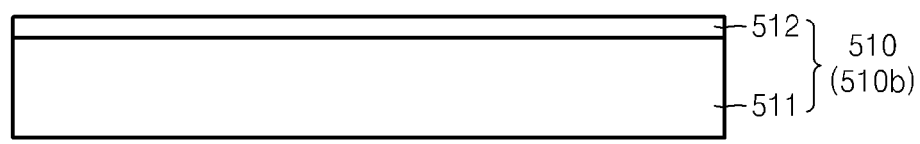

Referring to FIG. 13, in operation S211, a first catalyst metal layer 510 is prepared. Referring to FIGS. 14A and 14B, the first catalyst metal layer 510 of the present exemplary embodiment may refer to a single catalyst metal layer 510a, or a stacked structure 510b including a catalyst metal 512 disposed on a base layer 511.

As shown in FIG. 14A, the first catalyst metal layer 510 may include at least one metal material selected from the group consisting of Ni, Co, Fe, Pt, Au, Ag, Al, Cr, Cu, Mg, Mn, Mo, Rh, Si, Ta, Ti, W, U, V, Pd, Y, and Zr.

As shown in FIG. 14B, when the first catalyst metal layer 510 includes the catalyst metal 512 formed on the base layer 511, the catalyst metal 512 may be selected from the metal group for the catalyst layer 510 of FIG. 14A. In addition, the base layer 511 may be formed of an inorganic material such as glass, GaN, or silica, or a metal such as Ni, Cu, or W. Otherwise, the base layer 511 may be formed of $SiO_2$, $Si_3N_4$, SiON, SIOF, BN, hydrogen silsesquioxane (HSQ), xerogel, aerogel, poly naphthalene, amorphous carbon fluoride (a-CF), SiOC, MSQ, or black diamond.

Hereinafter, it is assumed that the first catalyst metal layer 510 shown in FIG. 14A is used, for convenience of description.

Figure 15:
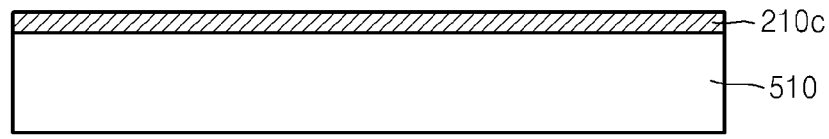

Referring to FIGS. 13 and 15, in operation S212, the first graphene layer 210c is formed on the first catalyst metal layer 510. For example, the first graphene layer 210c may be disposed according to a CVD method. A carbon supply source in a vapor phase is injected into a chamber (not shown) in which the first catalyst metal layer 510 is disposed and temperature of the chamber is controlled to form the first graphene layer 210c on the first catalyst metal layer 510, wherein the carbon supply source in a vapor phase is one or more selected from the group consisting of carbon monoxide, ethane, ethylene, ethanol, acetylene, propane, propylene, methane, butane, butadiene, pentane, pentene, cyclopentadiene, hexane, cyclohexane, benzene, and toluene. A sufficient amount of carbon is adsorbed on the first catalyst metal layer 510, and then, cooled down rapidly so that carbons are separated from the first catalyst metal 510 and crystallized on the surface of the first catalyst metal layer 510. Then, the first graphene layer 210c is formed, as shown in FIG. 15.

Figure 16:
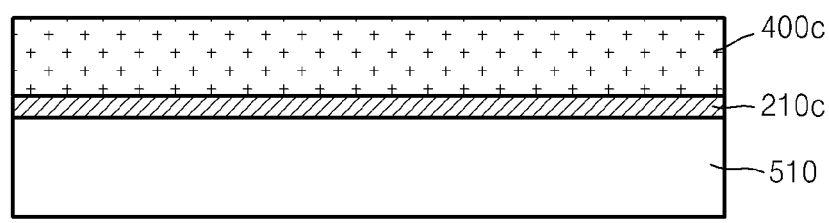

Referring to FIGS. 13 and 16, in operation S213, a carrier 400c is disposed on the first graphene layer 210c. The carrier 400c is a medium for conveying the first graphene layer 210c. Opposite side surfaces of the carrier 400c and the first graphene layer 210c may contact each other.

Figure 17:
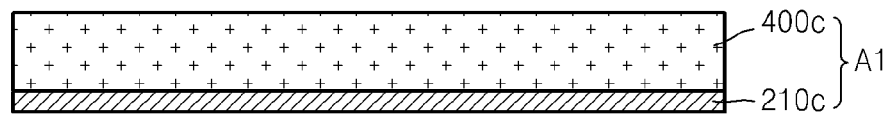
Figure 18:
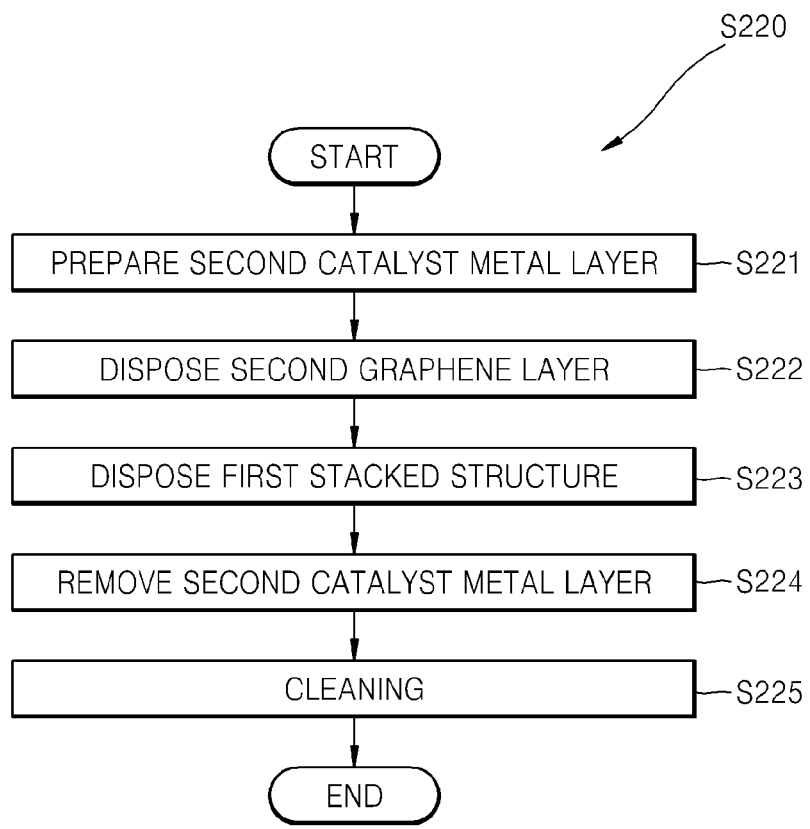
FIG. 18 illustrates a flowchart of an operation (S220) of disposing a second graphene layer shown in FIG. 12, according to an exemplary embodiment.

Referring to FIGS. 13 and 17, in operation S214, the first catalyst metal layer 510 is removed. The first catalyst metal layer 510 may be removed by etching. An etchant may be acid, hydrogen fluoride (HF), buffer oxide etch (BOE), $FeCl_3$ solution, or $Fe(No_3)_3$ solution. Once the first catalyst metal layer 510 is removed, a first stacked structure A1 in which the first graphene layer 210c is disposed on the carrier 400c is formed, as shown in FIG. 17.

Referring to FIG. 13, in operation S215, the first stacked structure A1 may be cleaned to remove remaining etchant.

Referring to FIG. 12 again, in operation S220, a second graphene layer is disposed on the first graphene layer 210c in order to transfer the first graphene layer 210c and the second graphene layer onto the target substrate by using the carrier 400c.

Hereinafter, operation S220 of disposing the second graphene layer will be described in more detail with reference to FIGS. 18 through 22.

Figure 19A:
FIGS. 19 through 22 illustrate cross-sectional views corresponding to the operations of FIG. 18, according to an exemplary embodiment.
Figure 19B:
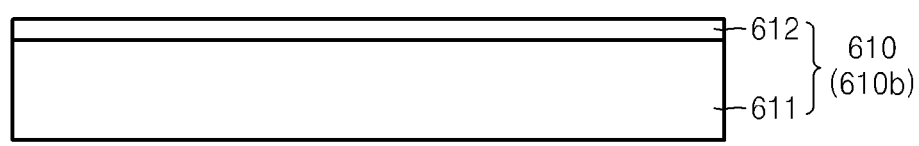

Referring to FIG. 18, in operation S221, a second catalyst metal layer 610 is prepared. Referring to FIGS. 19A and 19B, the second catalyst metal layer 610 of the present exemplary embodiment may refer to a single catalyst metal layer 610a, or a stacked structure 610b including a catalyst metal 612 disposed on a base layer 611.

As shown in FIG. 19A, the second catalyst metal layer 610 may include at least one metal material selected from the group consisting of Ni, Co, Fe, Pt, Au, Ag, Al, Cr, Cu, Mg, Mn, Mo, Rh, Si, Ta, Ti, W, U, V, Pd, Y, and Zr.

As shown in FIG. 19B, when the second catalyst metal layer 610 includes the catalyst metal 612 formed on the base layer 611, the catalyst metal 612 may be selected from the metal group for the catalyst layer 610 of FIG. 19A. In addition, the base layer 611 may be formed of an inorganic material such as glass, GaN, or silica, or a metal such as Ni, Cu, or W. Otherwise, the base layer 611 may be formed of $SiO_2$, $Si_3N_4$, SiON, SIOF, BN, hydrogen HSQ, xerogel, aerogel, poly naphthalene, a-CF, SiOC, MSQ, or black diamond.

Hereinafter, it is assumed that the second catalyst metal layer 610 shown in FIG. 19A is used, for convenience of description.

Figure 20:
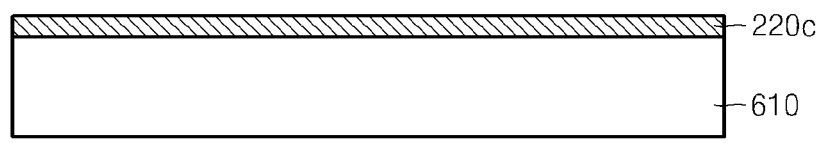

Referring to FIGS. 18 and 20, in operation S222, the second graphene layer 220c is formed on the second catalyst metal layer 610. For example, the second graphene layer 220c may be disposed according to a CVD method. A carbon supply source in a vapor phase is injected into a chamber (not shown) in which the second catalyst metal layer 610 is disposed and temperature of the chamber is controlled to form the second graphene layer 220c on the second catalyst metal layer 610, wherein the carbon supply source in a vapor phase is one or more selected from the group consisting of carbon monoxide, ethane, ethylene, ethanol, acetylene, propane, propylene, methane, butane, butadiene, pentane, pentene, cyclopentadiene, hexane, cyclohexane, benzene, and toluene. A sufficient amount of carbon is adsorbed on the second catalyst metal layer 610, and then, cooled down rapidly so that carbons are separated from the second catalyst metal layer 610 and crystallized on the surface of the second catalyst metal layer 610. As a result, the second graphene layer 220c is formed as shown in FIG. 20.

Figure 21:
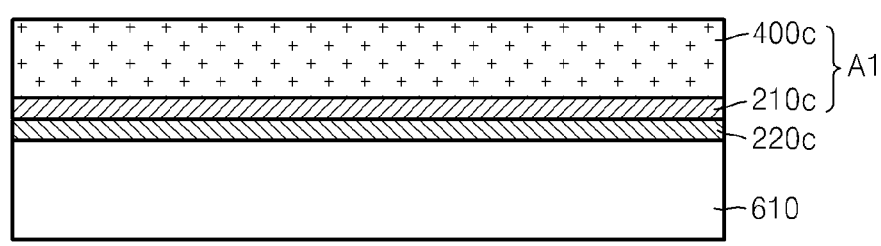

Referring to FIGS. 18 and 21, in operation S223, the first stacked structure A1 including the carrier 400c and the first graphene layer 210c is disposed on the second graphene layer 220c. The carrier 400c is a medium for moving the first and second graphene layers 210c and 220c. By contacting a surface of the first stacked structure A1 to a surface of the second graphene layer 220c, the carrier 400c, the first graphene layer 210c, and the second graphene layer 220c may be stacked sequentially.

Figure 22:
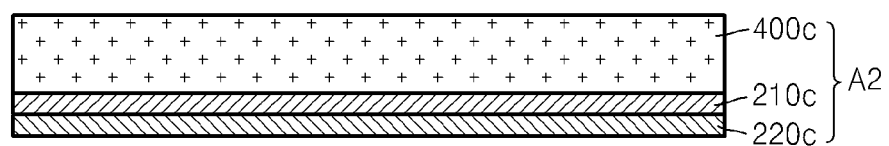

Referring to FIGS. 18 and 22, in operation S224, the second catalyst metal layer 610 is removed. For example, the second catalyst metal layer 610 may be removed by etching. An etchant may be acid, HF, BOE, $FeCl_3$ solution, or $Fe(No_3)_3$ solution. Once the second catalyst metal layer 610 is removed, a second stacked structure A2 in which the second graphene layer 220c is disposed on the first stacked structure A1 is formed, as shown in FIG. 22.

Referring to FIG. 18, the second stacked structure A2 may be cleaned to remove remaining etchant in operation S225.

Referring to FIG. 12 again, in operation S230, the first and second graphene layers 210c and 220c are integrated by being transferred onto a target substrate 100c (lamination). Referring to FIGS. 23 and 24, the second stacked structure A2 in which the carrier 400c, the first graphene layer 210a, and the second graphene layer 220c are sequentially formed is disposed on the target substrate 100c, a laminator 40c applies a predetermined pressure on the second stacked structure A2. Using the pressure applied by the laminator 40c, the first and second graphene layers 210c and 220c may be integrated with each other on the target substrate 100c.

In operation S240, the carrier 400c is removed. For example, if the carrier 400c is a thermal release tape, the laminator 40c may remove the carrier 400c while integrating the first and second graphene layers 210c and 220c. The laminator 40c may be heated to radiate heat and remove the thermal release tape. To do this, the laminator 40c may include a material that has thermal conductivity such as a metal.

FIG. 25 shows when the graphene sheet 200c including the first and second graphene layers 210c and 220c is transferred onto the target substrate 100c, and that the carrier 400c that is the thermal release tape has been removed.

In the present exemplary embodiment, since the carrier 400c is a thermal release tape, the carrier 400c is removed by heat. However, the inventive concept is not limited thereto. That is, the carrier 400c may be removed in various manners subject to a material forming the carrier 400c. As an example, if the carrier 400c includes a material such as PMMA, the modified epoxy resin, the PI adhesive, or the imide adhesive, the carrier 400c may be removed by alkali. As another example, if the carrier 400c includes a material such as the modified epoxy resin, the carrier 400c may be removed using an organic solvent such as ketone, ester, or chlorinated hydrocarbon. Otherwise, if a material such as the water-soluble acryl resin, the water-soluble epoxy resin, or the water-soluble polyurethane resin is used as the carrier 400c, the carrier 400c may be removed using water.

The substrate 100c is a target substrate on which a final form of the graphene sheet 200c is formed to be used, and may be formed of polymer, such as, PET or PI.

The graphene sheet 200c transferred on the substrate 100c includes a plurality of graphene layers, that is, the first and second graphene layers 210c and 220c. Here, at least one of the first and second graphene layers 210c and 220c may have at least one damaged region. For example, damage such as wrinkles, lattice disorder, and incomplete transfer may occur during disposition of the graphene layers 210c and 220c.

In particular, when the carrier 400c is removed, the first graphene layer 210c that directly contacts the carrier 400c may be damaged. For example, since a surface roughness of the carrier 400c, that is, a thermal release tape, is greater than a thickness of the first graphene layer 210c, the first graphene layer 210c contacting the carrier 400c may be damaged during the removing of the carrier 400c, as shown in FIG. 25.

According to an exemplary embodiment, since the second graphene layer 220c is disposed on the opposite surface of the first graphene layer 210c facing the carrier 400c in order to compensate for the damaged region 211c of the first graphene layer 210c, the surface resistance characteristics of the graphene sheet 200c may be improved. The first graphene layer 210c is a buffer layer, and thus, the surface resistance characteristics of the graphene sheet 200c, including the first and second graphene layers 210c and 220c, are improved and the surface resistance uniformity is also improved.

Referring to FIG. 12, in operation S250, the graphene sheet 200c formed on the substrate 100c may be cleaned to remove impurities generated after operation S240. However, the cleaning process may be omitted.

In operation S260, the graphene sheet 200c, including the first and second graphene layers 210c and 220c, may be doped. Through the additional doping process, a surface resistance of the graphene sheet 200c may be improved. However, the doping process may be omitted.

In operation S270, a protective film (not shown) may be disposed on the graphene sheet 200c to protect the graphene sheet 200c against external contamination materials. As another example, the substrate 100c itself may be the protective film, and in this case, the current process may not be performed.

According to the method of forming the multi-layered graphene, operations S210 through S230 may be repeatedly performed as many times as the number of graphene layers forming the graphene sheet. For example, if the graphene sheet including three graphene layers is fabricated, a new graphene layer may be disposed on the second graphene layer 220c in the second stacked structure A2 shown in FIG. 22. The new graphene layer may be disposed in the same manner as described with reference to FIGS. 18 through 21. A stacked structure on which the new graphene layer is disposed is transferred onto the substrate and the carrier is removed, and then, a graphene sheet including three graphene layers may be fabricated.

As another example, if a graphene sheet including four graphene layers is to be fabricated, the process of disposing a new graphene layer on the second graphene layer 220c of the second stacked structure A2 shown in FIG. 22 is performed twice, and thus, a stacked structure, including the carrier and the four graphene layers disposed on the carrier, may be formed. After transferring the stacked structure on the substrate, the carrier is removed to form the graphene sheet including four graphene layers.

The number of graphene layers and the number of repetitions the fabrication is performed may be determined according to a kind of product in which the graphene sheet is used. For example, since light transmittance is reduced by about 2.3% whenever the number of graphene layers increases, and thus, the light transmittance and the surface resistance may be considered, as described above.

Table 3 represents surface resistance values and uniformity of graphene sheets that are fabricated according to the above exemplary embodiment (Third Example) and a second comparative example.

Figure 27:
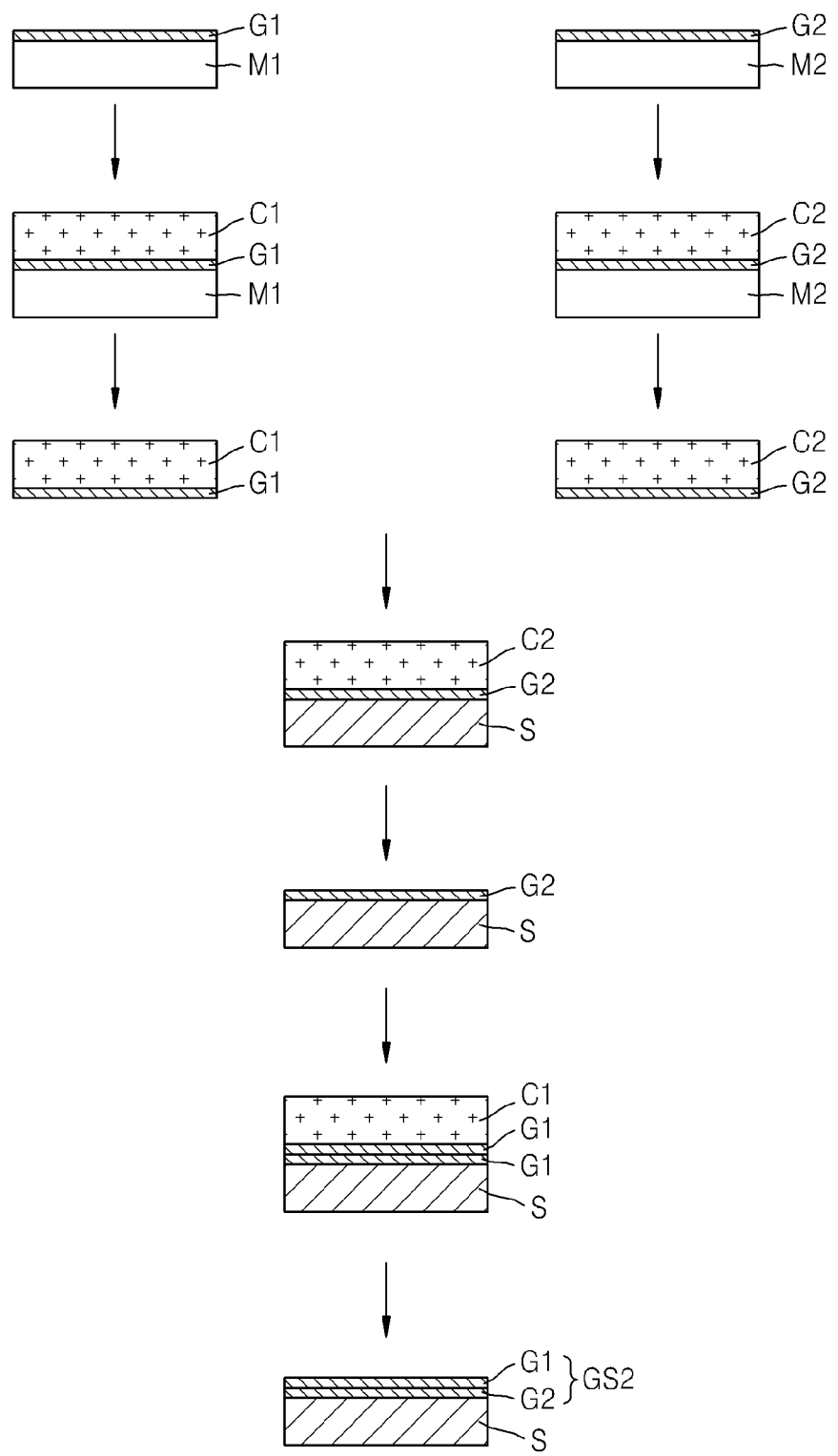
FIG. 27 illustrates a method of fabricating a graphene sheet including a plurality of graphene layers, according to a second comparative example.

The graphene sheet according to the second comparative example was fabricated as follows (refer to FIG. 27).

First, a first graphene layer G1 is disposed on a first catalyst metal layer M1 including copper by a CVD method, and a second graphene layer G2 is disposed on a second catalyst metal layer M2 including copper by a CVD method. In addition, first and second carriers C1 and C2 are disposed respectively on the first and second graphene layers G1 and G2, and the first and second catalyst metal layers M1 and M2 are removed by etching. The first and second carriers C1 and C2 are thermal release tapes.

The second carrier C2 and the second graphene layer G2 are disposed on a substrate S, and then, the second carrier C2 is heated to be removed, then the second graphene layer G2 remains on the substrate S. Then, the first carrier C1 and the first graphene layer G1 are disposed on the second graphene layer G2, and then, the first carrier C1 is heated to be removed. Then, the graphene sheet GS2 according to the second comparative example is obtained.

The graphene sheets according to the above exemplary embodiment and the second comparative example are fabricated by using the thermal release tape as the carrier, and surface resistance is measured by an automatic surface resistor. The graphene sheets according to the above exemplary embodiment and the second comparative example both include two graphene layers, respectively.

TABLE 3

| | | Second Comparative example | Exemplary Embodiment |
|---|---|---|---|
| Surface resistance at each measuring point (Ω) | 1 | 846.65 | 346.59 |
| | 2 | 921.49 | 347.32 |
| | 3 | 1107.4 | 374.85 |
| Results | Avg. | 958.5 | 356.253 |
| | Uniformity (%) | 13.6% | 3.97% |

Referring to Table 3, an average value of the surface resistance of the graphene sheet GS2 formed according to the second comparative example is about 958.5Ω, while the average value of the surface resistance of the graphene sheet formed according to the present exemplary embodiment is greatly reduced to about 356.253Ω. In addition, the surface resistance uniformity is also improved.

According to the second comparative example, the first and second graphene layers G1 and G2 may be integrated by transferring the second graphene layer G2 on the substrate S, and then, transferring the first graphene layer G1 on the second graphene layer G2. Here, when the second carrier C2 is removed after transferring the second graphene layer G2 on the substrate S, the second carrier C2 damages the second graphene layer G2 (first damage). When the first carrier C1 is removed after transferring the first graphene layer G1 on the second graphene layer G2, the first carrier C1 damages the first graphene layer G1 (second damage). Since surface roughness of the thermal release tape used as the first and second carriers C1 and C2 is greater than thicknesses of the first and second graphene layers G1 and G2, the graphene layers G1 and G2 are damaged when the thermal release tape is removed.

On the other hand, according to the present exemplary embodiment, the plurality of graphene layers, namely, the first and second graphene layers 210c and 220c, are transferred onto the substrate 100c using one carrier 400c, and thus, one carrier 400c is removed. In addition, the first graphene layer 210c that directly contacts the carrier 400c is only damaged when the carrier 400c is removed.

That is, in the graphene sheet GS2 according to the second comparative example, the first and second graphene layers G1 and G2 are all damaged, while the first graphene layer 210c between the first and second graphene layers 210c and 220c is only damaged in the graphene sheet 200c according to the present exemplary embodiment. Thus, surface resistance characteristic of the graphene sheet 200c is superior to that of the graphene sheet GS2 of the second comparative example.

According to the present exemplary embodiment, only one carrier is used regardless of the number of graphene layers fabricating a graphene sheet, and thus, fabrication costs of the graphene sheet may be reduced. As described above, the second graphene layer 220c is disposed on the first graphene layer 210c of the first stacked structure A1 to form the second stacked structure A2, and then, the first and second graphene layers 210c and 220c are integrated on the substrate 100c. Therefore, one carrier 400c may be used to fabricate the graphene sheet 200c.

According to the exemplary embodiments, a graphene sheet of high quality and having low surface resistance may be fabricated.

According to the exemplary embodiments, a graphene layer that is damaged during fabrication of the graphene sheet may be re-usable.

In addition, according to the exemplary embodiments, the number of carriers that are used to transfer graphene layers on the substrate may be reduced, and thus fabrication costs of the graphene sheet may be reduced.

While the exemplary embodiments have been particularly shown and described, it will be understood by those of ordinary skill in the art that various changes in form and details may be made therein without departing from the spirit and scope of the inventive concept as defined by the following claims.

What is claimed is:

1. A method of fabricating multi-layered graphene, the method comprising:
   disposing a first graphene layer on a carrier;
   disposing at least one second graphene layer on the first graphene layer to form a graphene sheet disposed on the carrier;
   transferring the graphene sheet disposed on the carrier onto a substrate; and
   removing the carrier;
   wherein a surface roughness of the carrier is greater than a thickness of the first graphene layer and a thickness of the at least one second graphene layer.

2. The method of claim 1, wherein the carrier comprises polymer.

3. The method of claim 1, wherein the carrier comprises a thermal release tape.

4. The method of claim 3, wherein the transferring the graphene sheet onto the substrate comprises:
disposing a heated laminator on the carrier; and
compressing the carrier by using the heated laminator.

5. The method of claim 1, wherein the disposing the at least one second graphene layer comprises disposing N different graphene layers on the first graphene layer, and,
wherein the disposing the N different graphene layers comprises repeating following operations N times:
disposing one graphene layer on a catalyst metal layer;
disposing the one graphene layer, disposed on the catalyst metal layer, on the first graphene layer that is disposed on the carrier; and
removing the second catalyst layer, and
wherein N is a natural number equal to 2 or greater.

6. The method of claim 1,
wherein the carrier comprises at least one of polymer and a thermal release tape, and
wherein, in the disposing the at least one second graphene layer on the first graphene layer, the carrier is not used.

7. A method of fabricating multi-layered graphene, the method comprising the following steps in order:
(1) disposing a first graphene layer on a thermal release tape;
(2) disposing at least one second graphene layer on the first graphene layer disposed on the thermal release tape to form a graphene sheet disposed on the thermal release tape;
(3) transferring the graphene sheet disposed on the thermal release tape onto a substrate; and
(4) removing the thermal release tape,
wherein the step (4) is performed only once in the method, and
wherein a surface roughness of the thermal adhesive tape is greater than a thickness of the first graphene layer and a thickness of the at least one second graphene layer.

8. The method of claim 7, further comprising laminating the first graphene layer and the at least one second graphene layer; the step of laminating comprising:
conveying a stacked structure including the first graphene layer and the at least one second graphene layer toward a laminator; and
integrating the first graphene layer and the at least one second graphene layer with one another using the laminator,
wherein the laminator radiates heat.

* * * * *